United States Patent [19]

Rye et al.

[11] Patent Number: 5,380,474
[45] Date of Patent: Jan. 10, 1995

[54] METHODS FOR PATTERNED DEPOSITION ON A SUBSTRATE

[75] Inventors: Robert R. Rye; Antonio J. Ricco; M. J. Hampden-Smith; T. T. Kodas, all of Albuquerque, N. Mex.

[73] Assignee: Sandia Corporation, Albuquerque, N. Mex.

[21] Appl. No.: 65,211

[22] Filed: May 20, 1993

[51] Int. Cl.⁶ ............................................. B05D 3/06
[52] U.S. Cl. ................................ 264/25; 156/635; 156/643; 264/83; 427/555
[58] Field of Search ................ 264/22, 25, 83, 81; 427/534, 535, 554, 555; 156/628, 635, 643; 219/121.68

[56] References Cited

U.S. PATENT DOCUMENTS

| | | | |
|---|---|---|---|
| 4,125,649 | 11/1978 | Donovan et al. | 156/628 |
| 4,417,948 | 11/1983 | Mayne-Barton et al. | 156/643 |
| 4,624,736 | 11/1986 | Gee et al. | 427/554 |
| 4,780,177 | 10/1988 | Wojnerowski et al. | 156/643 |
| 4,877,644 | 10/1989 | Wu et al. | 156/643 |
| 4,933,060 | 6/1990 | Prohaska et al. | 430/296 |
| 4,941,940 | 7/1990 | Patel et al. | 156/628 |
| 4,981,715 | 1/1991 | Hirsch et al. | 427/555 |
| 5,051,312 | 9/1991 | Allmer | 264/22 |
| 5,066,565 | 11/1991 | Martinez et al. | 430/296 |
| 5,211,803 | 5/1993 | Johnson et al. | 427/554 |

OTHER PUBLICATIONS

H. K. Shin et al, "Selective Low-Temperature Chemical Vapor Deposition of Copper from (Hexafluoroacetylacetonato) copper (I) trimethylphosphine, (hfa)CuP(Me)₃", Rev. Feb. 27, 1991, Communications, Adv. Mater 3, No. 5, pp. 246–248, (1991).

*Primary Examiner*—Mathieu D. Vargot
*Attorney, Agent, or Firm*—Timothy D. Stanley; George H. Libman

[57] ABSTRACT

A method is described for patterned depositions of a material onto a substrate. A surface of a polymeric substrate is first etched so as to form an etched layer having enhanced adhesions characteristics and then selected portions of the etched layer are removed so as to define a pattern having enhanced and diminished adhesion characteristics for the deposition of a conductor onto the remaining etched layer. In one embodiment, a surface of a PTFE substrate is chemically etched so as to improve the adhesion of copper thereto. Thereafter, selected portions of the etched surface are irradiated with a laser beam so as to remove the etched selected portions of the etched surface and form patterns of enhanced and diminished adhesion of copper thereto.

12 Claims, 2 Drawing Sheets

METHODS FOR PATTERNED DEPOSITION ON A SUBSTRATE

The United States Government has rights in this invention pursuant to Contract No. DE-AC04-76DP00789 between the Department of Energy and American Telephone and Telegraph Company.

BACKGROUND OF THE INVENTION

The present invention relates generally to methods for patterned depositions of a material onto a substrate and, more particularly, to methods for selectively depositing a conductor onto specified regions of a polymeric substrate.

Polymeric materials, in general, and fluoropolymers, specifically, have received increased interest in the electronics industry due to their attractive properties including: low dielectric constant, low dissipation factors, high thermal stability and high chemical resistance. However, the chemical and physical inertness of fluoropolymers, such as poly(tetrafluoroethylene) (PTFE), makes it difficult to deposit any material thereon. For this reason, copper films on PTFE are generally formed by mechanical rolling processes. With such a process it is difficult to produce narrow sub-micron sized line patterns. In addition, this technique disadvantageously can require a plurality of steps. Consequently, considerable interest has focused on alternative methods of depositing thin metal films on PTFE, e.g. ion plating, presputtering, plasma enhanced vapor deposition and heavy ion irradiation. More recently, Prohaska et al in U.S. Pat. No. 4,933,060 describe a method for preparing a fluoropolymeric substrate surface for deposition of a thin metal film thereon by etching a surface thereof with a reactive gas plasma process. Alternatively, Martinez et al in U.S. Pat. No. 5,066,565 describe a method of preparing a surface of a fluoropolymeric substrate for deposition of a thin metal film thereon by selectively irradiating the surface with an ionizing radiation source and then etching it to produce regions of the surface which have enhanced adhesion characteristics. The present invention provides novel methods which greatly enhance the ability to efficiently produce patterned depositions on a polymeric substrate having micron sized dimensions as shall be more fully described.

SUMMARY OF THE INVENTION

The present invention relates generally to methods for patterned depositions of a material onto a substrate. In particular, a method is described for the selective deposition of a conductor onto specified portions of the surface of a polymeric substrate. Initially, a surface of a polymeric substrate is etched to develop an etched layer having enhanced adhesion characteristics. Thereafter, selected portions of the etched layer can be removed so as to form patterned regions on the substrate having enhanced and diminished adhesion characteristics. A conductor can then be selectively deposited onto the remaining etched layer of the polymeric substrate. In one embodiment of the present invention, a of a PTFE substrate is chemically etched and selected portions of the etched layer can then be selectively ablated with a laser beam so as to form a pattern for the selective deposition of copper onto the remaining unablated portions of the etched layer.

These and other advantages of the present invention will be discussed more completely below. However, it will be understood that the detailed description and specific examples are illustrative of the present invention and that those skilled in the art will recognize that various changes and modifications in materials and apparatus will be apparent without departing from the scope of the present invention.

BRIEF DESCRIPTION OF THE DRAWINGS

The accompanying drawings, which are incorporated in and form part of the specification, illustrate the present invention and, together with the description, serve to explain the invention.

FIG. 1 a–d provide a schematic representation of the present invention. In particular.

DETAILED DESCRIPTION OF THE INVENTION

Figure 1A:
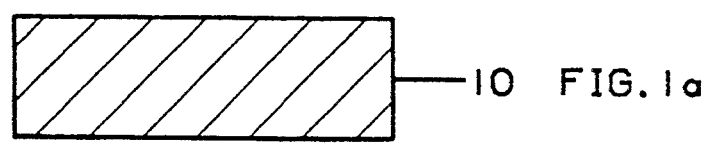
FIG. 1a is a cross-sectional view of a substrate.
Figure 1B:
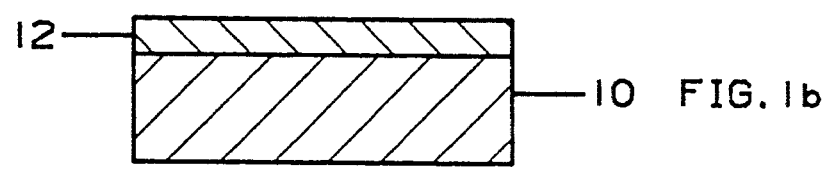
FIG. 1b is a cross-sectional view of the substrate in FIG. 1a having a surface of the substrate etched so as to form an etched layer.
Figure 1C:
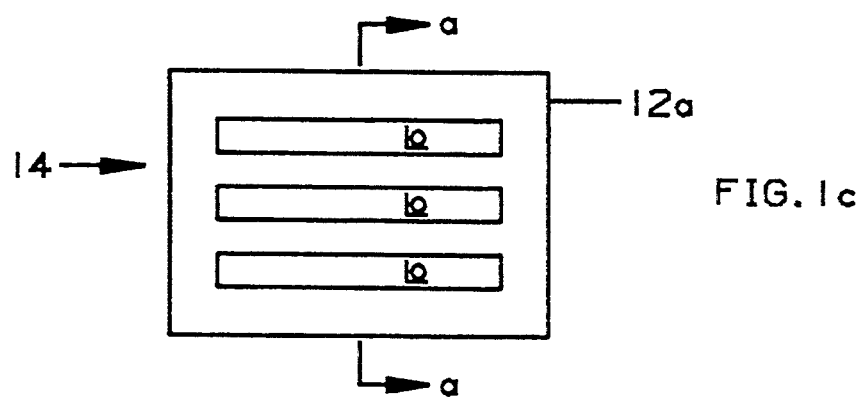
FIG. 1c is a plan view of the etched layer depicted in FIG. 1b depicting the selective removal of specified portions of the etched layer and exposing the underlying substrate.
Figure 1D:
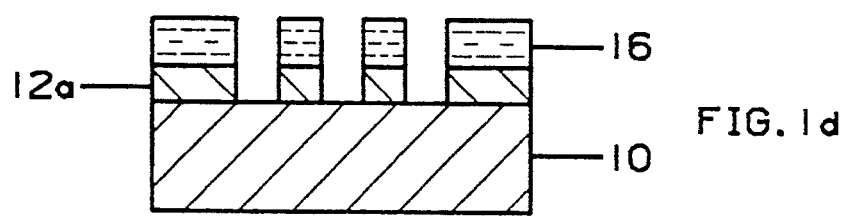
FIG. 1d is a cross-sectional view along section line a—a of FIG. 1c after the selective deposition of a material on the remaining etched layer.

The present invention provides novel methods for selectively depositing materials onto a substrate as generally depicted in FIGS. 1 a-d. In particular, a surface of substrate material 10 can be etched to form an etched layer 12. Portions of the etched layer 12 can then be selectively removed so as expose portions of the underlying unetched substrate 10 and form a pattern 14 for the deposition of a material onto the remaining portions 12a of the etched layer 12. A material 16 can then be selectively deposited onto the remaining etched layer 12a.

The present invention of patterned deposition of a material onto a substrate will now be discussed in more detail. In particular, the substrate material is preferably a polymeric material which is rich in carbon-fluorine bonds and includes fluoropolymeric materials such as PTFE and fluorinated ethylene-propylene copolymers. The fluoropolymers employed can also include any polymer which contains fluorine as an appended group. Typical fluoropolymers include but are not limited to homologues and derivatives of polytetrafluoroethylene, fluorinated ethylene-propylene copolymers, tetrafluoroethylene, PFA-perfluoroalkoxy resin, modified copolymer of ethylene and tetrafluoroethylene and the like. Most preferred fluoropolymers are polytetrafluoroethylene and fluorinated ethylene-propylene copolymers.

As indicated in FIGS. 1 a–d, the first step of the present invention comprises etching the substrate 10. Advantageously, an entire surface of the substrate 10 can be etched rather than having to employ more costly and complicated masking techniques to selectively etch portions of the surface of the substrate. Preferably, the surface can be chemically etched to form an etched layer 12. By way of example, such etching can include the use of chemical etchants such as sodium napthalenide, which are commercially available under the trademarked names TETRA ETCH (manufactured by W. L.

Gore & Associates, Flagstaff, Ariz.) and POLY ETCH (manufactured by Mathason Gas Products). Preferably, the etchant should selectively attack the carbon-fluorine (C-F) bonds and result in defluorination of the substrate surface. Such chemical etchants have been found effective in defluorinating the polymer substrate to depths of up to 3000 to 4000 Angstroms and thus provide a etched layer having increased adhesion characteristics over those of the unetched substrate surface. Additionally, the use of other etching techniques, such as ion bombardment and reactive gas plasma etching, as described by Prohaska earlier, can also be effective in defluorinating the substrate surface to depths of up to several hundred Angstroms and thus can also be productively used to enhance the adhesion characteristics of the substrate surface.

The etched layer 12 of the substrate 10 can now be selectively ablated so as to effectively remove substantially all of specified portions of the etched layer 12 and form pattern 14 exposing the unetched substrate 10. Fortuitously, the light adsorbing characteristics of the etched layer 12 are significantly different than those of the underlying polymeric substrate 10. In the case of PTFE, such difference in adsorption can be of the order of ~350 times greater for etched PTEF than for virgin PTFE. While such a feature is not critical to the implementation of the present invention, it can be used advantageously to self-limit the removal of the etched layer 12. That is, once the selected portion of the etched layer 12 has been removed, the removal process effectively comes to a halt thus ensuring that no more than the necessary amount of the substrate 10 is removed. In one embodiment of the present invention, a continuous wave or pulsed ultraviolet or visible wave-length laser can effectively be focused on only that portion of the etched layer 12 to be removed. The conditions of operation of the laser (e.g. scan rate, repetition rate, power delivered to the substrate etc.) can be varied over a wide range to control the removal of the etched layer 12. Specifically, for an Argon ion laser, the scan rate can be varied from static to 0.8 mm/sec and the power delivered to the substrate varied from ~10 mW to 400 mW, with a 1/e beam diameter of 10 microns. Thus, laser ablation can provide a method for forming patterns for deposition having micron sized dimensions. Ablation can occur at pressures ranging from 0.01 Torr to standard pressure. Alternatively, the etched layer 12 can be selectively ablated using a pulsed laser such as an examiner or YAG employing a projection mask interposed between the laser source and the etched layer 12.

Figure 2:
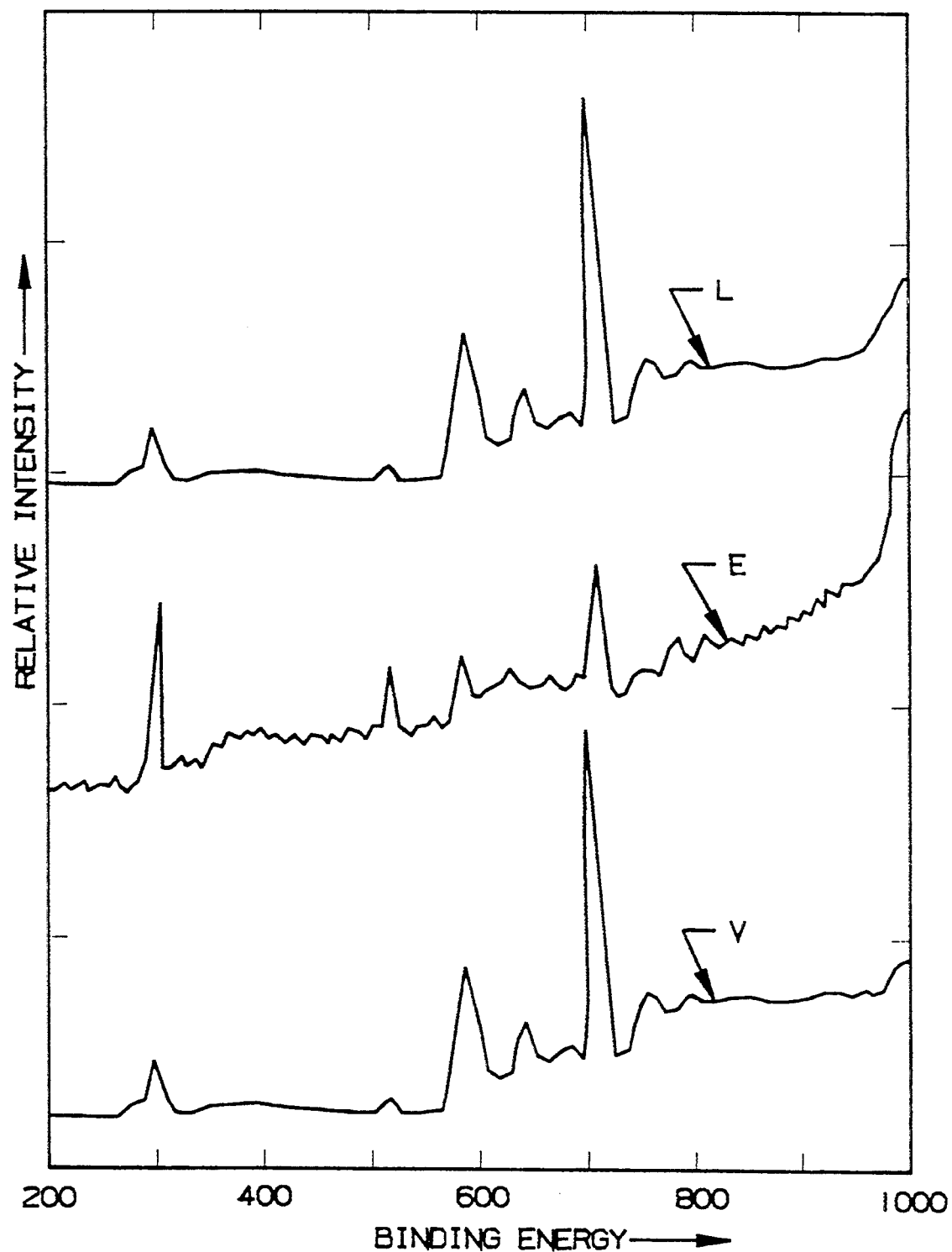
FIG. 2 is a schematic representation of a series of X-ray photoelectron spectra.

Looking now to FIG. 2, a series of X-ray photoelectron spectra are depicted which demonstrate the change in the characteristics of a PTFE surface after etching and ablation. In particular, the spectra labeled V represents virgin or unetched PTFE; the spectra labeled E represents the surface of a PTFE substrate after etching with a solution of sodium napthalenide; and the spectra labeled L represents the spectra of an etched surface of a PTFE surface after it has been ablated with an Argon laser. It can be seen in spectra E, that the substrate has been extensively defluorinated as demonstrated by the decrease in the fluorine to carbon ratio. It has been found that such defluorination can extend to depths of from 3000 to 4000 Angstroms in PTFE. The resulting structure of the etched layer of PTFE has been found to be very effective in increasing the adhesion characteristics of thin metal films to the substrate as well as providing sites for nucleation and growth of deposits on the etched layer. As can be seen, spectra L and V appear similar. That is, the etched layer has been substantially returned to its virgin non-adherent condition after ablation.

Having now prepared the substrate surface for selective deposition of a material, any one of several deposition processes can be used, without resort to masking or the like, to achieve patterned depositions of a desired material. In particular, a variety of chemical vapor deposition (CVD) techniques as well as thermal evaporation, ion plating, presputtering, plasma enhanced vapor deposition, heavy ion irradiation and electroless deposition of thin metal films onto a substrate can be effectively employed. In particular, copper has been selectively deposited onto PTFE surfaces prepared in accordance with the present invention as will be demonstrated in the examples below.

EXAMPLE 1

In a first example, copper was deposited onto PTFE substrate, which had previously been etched by dipping the substrate into a sodium napthalenide solution to form an etched layer of 3000 Angstroms. The etched layer was then selectively ablated with an Argon laser. In particular, CVD depositions of copper were carried out in a typical pyrex hot-wall reactor contained in two furnaces: a precursor evaporation furnace where a precursor was sublimed at a controlled temperature and then into a hot reactor furnace containing patterned PTFE samples. The system was evacuated with an oil diffusion pump that provided base pressures of 50 m Torr. Typical reactor operating conditions for a set of selected Cu precursors that were found to produce deposition selective to only those portions of the etched surface that were not laser ablated are shown in Table I below.

TABLE I

| Precursor | Substrate Temp. | Reactor Temp. | Base Pressure | Time |
|---|---|---|---|---|
| (hfac)Cu(PMe$_3$) | 60° C. | 200° C. | 50 mtorr | 1 hr |
| (hfac)Cu(1,5-COD) | 60° C. | 200° C. | 50 mtorr | 1 hr |
| (hfac)Cu(2-butyne) | 60° C. | 200° C. | 50 mtorr | 1 hr |

EXAMPLE 2

As a second example, copper was electrolessly deposited onto a PTFE substrate prepared for patterned deposition, as in Example 1, by etching followed by patterned laser ablation. In particular, the sample was first immersed in a solution of SnCl$_4$ for 6 min. After rinsing with distilled H$_2$O, the sample is next immersed in a solution of PdCl$_2$ for 2 min, and then again rinsed in H$_2$O. These first two steps produced metallic Pd nucleation sites. In a third step, the sample was immersed in a solution with copper sulfate (CuSO$_4$) and formaldehyde (HCHO) as the active components. The formaldehyde reduced the copper sulfate resulting in plating of metallic copper onto the Pd-activated surface. The film thickness of copper, in this case, can be determined by the immersion time. In contrast to Cu CVD in Example 1 where selective nucleation occurs only on the non-ablated surfaces, electroless deposition results in uniform copper coverage over the entire surface. However, the copper strongly adheres to only the non-ablated areas of the surface. The copper film can be cleanly and completely removed from the ablated areas. By way of example, by pressing adhesive tape to the outer copper surface and pulling, only the least adherent copper (i.e. that deposited on the ablated surface) is removed.

EXAMPLE 3

In a third example, the procedure for etching and depositing copper onto a PTFE substrate was the same as example 1, except that a Lambda Physik EMG 201 MSC excimer laser was used for selectively ablating the etched PTFE substrate. The laser was operated at 248 nm (KrF), 10 Hz repetition rate and 100 mJ/pulse output energy. The beam exiting the laser covered an area of 22 mm×10 mm and was passed through a 10 mm×10 mm aperture, which was imaged onto the substrate by a single quartz lens giving a factor of 3 size reduction. The energy density on the substrate was approximately 0.5 J/cm$^2$. The exposure time was varied roughly 10. Efficient ablation of the etched surface was observed leaving a white surface having the appearance of unetched PTFE. Cu CVD onto such an excimer laser ablated PTFE surface occurred similar to that with excimer laser.

While particular embodiments of the present invention have been described for patterned deposition of a material onto a substrate, it is not intended that the invention be limited thereby. As such, it will be apparent to those skilled in the art that various changes and modifications may be made to the invention as described without departing from the scope of claims appended hereto.

We claim:

1. A method for patterned deposition of a material onto a substrate, comprising the steps of:
   a) etching a surface of the substrate to enhance adhesion characteristics of the surface;
   b) selectively removing portions of the etched surface with a laser; and
   c) depositing a material only onto the remaining portions of the etched surface.

2. The method of claim 1, wherein the step of depositing includes chemical vapor deposition.

3. The method of claim 1, wherein the step of depositing includes electroless deposition.

4. The method of claim 1, wherein the material is copper.

5. The method of claim 1, wherein the substrate material comprises a fluoropolymer.

6. The method of claim 1, wherein the step of etching the substrate surface comprises chemically etching.

7. The method of claim 1, wherein the step of etching comprises reactive gas plasma etching.

8. The method of claim 4, wherein the laser beam is generated with a laser source selected from the group consisting of Argon, Neon, and excimer.

9. A method for patterned deposition of a material onto a substrate, comprising the steps of:
   a) forming a layer on a surface of the substrate having enhanced adhesion characteristics;
   b) selectively removing portions of the layer with a laser so as to form patterns of enhanced and diminished adhesion characteristics on the substrate surface; and
   c) selectively depositing a material onto the substrate according to the pattern of enhanced adhesion characteristics.

10. The method of claim 9, wherein the step of depositing a material onto the substrate comprises a deposition process selected from the group consisting of chemical vapor deposition, ion plating, presputtering, plasma enhanced vapor deposition, heavy ion irradiation and thermal evaporation.

11. The method of claim 9, wherein the substrate material comprises a fluoropolymer.

12. The method of claim 11, wherein the substrate material is selected from the group consisting of poly(tetrafluoroethylene) and homologues and derivatives of poly(tetrafluoroethylene), fluorinated ethylene-propylene copolymer, and PFA-perfluoroalkoxy resin.

* * * * *